(12) United States Patent
Ferrieres-Zhao et al.

(10) Patent No.: US 11,110,857 B2
(45) Date of Patent: Sep. 7, 2021

(54) LUMINOUS LAMINATED AUTOMOTIVE GLAZING COMPRISING INORGANIC LIGHT-EMITTING DIODES AND MANUFACTURE THEREOF

(71) Applicant: SAINT-GOBAIN GLASS FRANCE, Courbevoie (FR)

(72) Inventors: Li Ferrieres-Zhao, Compiegne (FR); Christophe Kleo, Attichy (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 113 days.

(21) Appl. No.: 16/603,107

(22) PCT Filed: Apr. 5, 2018

(86) PCT No.: PCT/FR2018/050853
§ 371 (c)(1),
(2) Date: Oct. 4, 2019

(87) PCT Pub. No.: WO2018/185438
PCT Pub. Date: Oct. 11, 2018

(65) Prior Publication Data
US 2021/0107401 A1    Apr. 15, 2021

(30) Foreign Application Priority Data
Apr. 7, 2017  (FR) ..................... 1753052

(51) Int. Cl.
*B60Q 3/208*  (2017.01)
*B60Q 3/41*  (2017.01)
(Continued)

(52) U.S. Cl.
CPC ........ *B60Q 3/208* (2017.02); *B32B 17/10036* (2013.01); *B32B 17/1077* (2013.01);
(Continued)

(58) Field of Classification Search
CPC .......... B60Q 3/208; B60Q 3/41; B60Q 1/268; B32B 17/0036; B32B 17/10541;
(Continued)

(56) References Cited

U.S. PATENT DOCUMENTS

| 9,568,180 B2 * | 2/2017 | Verrat-Debailleul ... F21V 29/74 |
| 2015/0146286 A1 | 5/2015 | Hagen et al. |
| 2015/0298601 A1 * | 10/2015 | Bott .................. B32B 17/10091 362/520 |

FOREIGN PATENT DOCUMENTS

| WO | WO 01/90787 A1 | 11/2001 |
| WO | WO 2004/025334 A2 | 3/2004 |

(Continued)

OTHER PUBLICATIONS

International Search Report as issued in International Patent Application No. PCT/FR2018/050853, dated Jul. 13, 2018.

*Primary Examiner* — Laura K Tso
(74) *Attorney, Agent, or Firm* — Pillsbury Winthrop Shaw Pittman LLP

(57) ABSTRACT

A luminous laminated automotive glazing with diodes peripherally on a diode carrier facing the edge face of the interior glass equipped with a recess, a profiled bead and a protective adhesive strip between the diode carrier and the bead.

20 Claims, 5 Drawing Sheets

(51) Int. Cl.
- *B32B 17/10* (2006.01)
- *B61D 29/00* (2006.01)
- *F21V 19/00* (2006.01)
- *F21W 106/00* (2018.01)
- *H01L 33/48* (2010.01)
- *H01L 33/52* (2010.01)
- *F21V 8/00* (2006.01)
- *B60Q 1/26* (2006.01)
- *F21Y 115/10* (2016.01)
- *H01L 33/50* (2010.01)
- *H01L 33/60* (2010.01)
- *H01L 33/62* (2010.01)

(52) U.S. Cl.
CPC .. *B32B 17/10541* (2013.01); *B32B 17/10761* (2013.01); *B60Q 3/41* (2017.02); *B61D 29/00* (2013.01); *F21V 19/0015* (2013.01); *B60Q 1/268* (2013.01); *F21W 2106/00* (2018.01); *F21Y 2115/10* (2016.08); *G02B 6/0068* (2013.01); *G02B 6/0073* (2013.01); *G02B 6/0076* (2013.01); *G02B 6/0091* (2013.01); *H01L 33/486* (2013.01); *H01L 33/50* (2013.01); *H01L 33/52* (2013.01); *H01L 33/60* (2013.01); *H01L 33/62* (2013.01)

(58) Field of Classification Search
CPC ........ B32B 17/10761; B32B 17/10077; B32B 17/10293; G02B 6/0091; G02B 6/0068; G02B 6/0073; G02B 6/0076; B61D 29/00; F21V 19/0015; F21W 2106/00; H01L 33/486; H01L 33/52
USPC .................................................. 362/545, 503
See application file for complete search history.

(56) References Cited

FOREIGN PATENT DOCUMENTS

| WO | WO 2008/059170 A2 | 5/2008 |
| WO | WO 2010/049638 A1 | 5/2010 |
| WO | WO 2010/136702 A1 | 12/2010 |
| WO | WO 2015/101745 A1 | 7/2015 |
| WO | WO 2015/173516 A1 | 11/2015 |

* cited by examiner

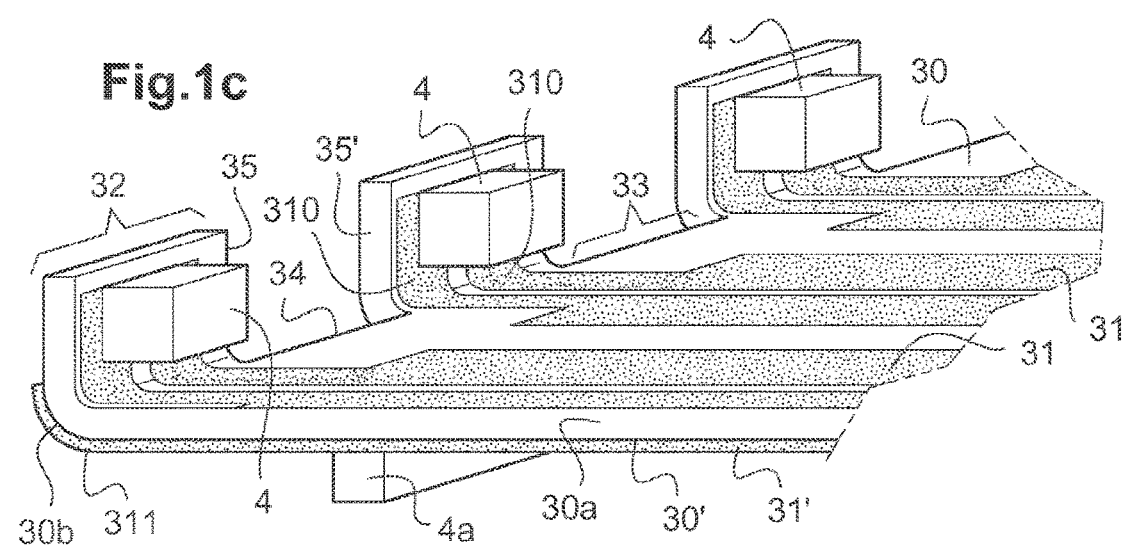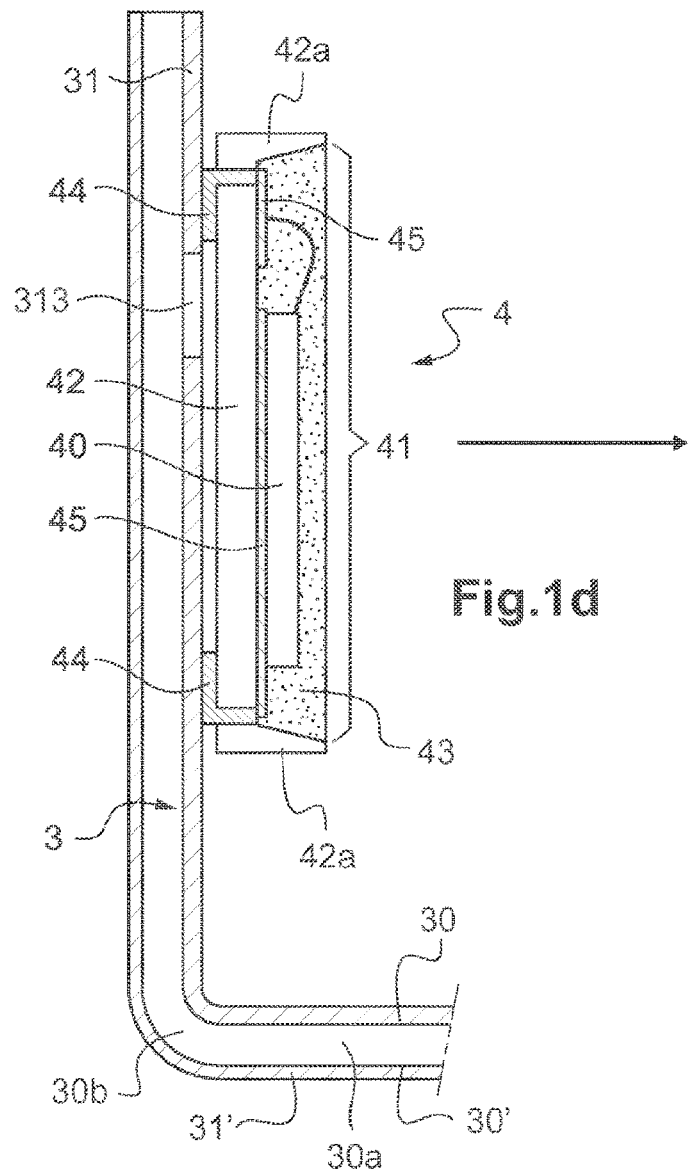

LUMINOUS LAMINATED AUTOMOTIVE GLAZING COMPRISING INORGANIC LIGHT-EMITTING DIODES AND MANUFACTURE THEREOF

CROSS-REFERENCE TO RELATED APPLICATIONS

This application is the U.S. National Stage of PCT/FR2018/050853, filed Apr. 5, 2018, which in turn claims priority to French patent application number 1753052 filed Apr. 7, 2017. The content of these applications are incorporated herein by reference in their entireties.

FIELD

The present invention relates to automotive glazings, and in particular glazings comprising light-emitting diodes, and to the process for manufacturing such glazings.

BACKGROUND

Light-emitting diodes (LEDs) are increasingly used in vehicles.

FIG. 16 of WO 2010/049638 thus provoked proposes a luminous automotive glazed roof comprising a laminated glazing including an interior glazing, an exterior glazing and a lamination interlayer made of plastic located between the exterior and interior glazings.

The interior glazing having a face called face F3 that is oriented toward the lamination interlayer, a first edge face and a face called face F4, the lamination interlayer having what is called an external end face on the same side as the first and second edge faces.

The exterior glazing having an exterior face F1, a second edge face on the side of the first edge face and an internal face F2 that is oriented toward the lamination interlayer.

The luminous glazed roof includes under a peripheral edge of said face F2, a plurality of aligned side-emitting inorganic light-emitting diodes that are spaced apart from one another and that each include a front emitting surface that is located facing said first edge face, each diode being in a through-hole, called a recess, of the second edge face.

The diodes are on a main face F1 of a carrier called the diode carrier including conductive circuits that supply the diodes, the carrier of conductive circuits thus including what are called bearing portions for the diodes and the carrier having what is called a fastening portion that is adhesively bonded to a peripheral edge B4 of the face F4 by an adhesive. Moreover, the emitting faces are adhesively bonded to the second edge face by an adhesive that forms a barrier that is seal tight to the polymeric encapsulation material made of black polyurethane (PU) manufactured by injection molding. This envelope conventionally serves as a barrier to water or any other liquid (protects from infiltrations) in a roof.

The panoramic glazed roof is fastened by adhesively bonding peripheral edges of the internal glazing to the body of the roof.

This glazing is a satisfactory solution with regard to the positioning of the light-emitting diodes but is capable of improvement in so far as the transparent adhesive located between each light-emitting diode and the edge face may lose its barrier capacities over time, in particular under the effect of climatic cycles, or even induce an uncontrolled variation in color of the light emitted by each diode.

SUMMARY

In an aspect of the invention, there is provided a luminous automotive glazing, said glazing comprising:
  a laminated glazing including a first transparent sheet of glass or plastic forming an interior glazing, a second transparent sheet of glass or plastic forming an exterior glazing and a lamination interlayer made of plastic located between the exterior and interior glazings
  the interior glazing having a main face that is oriented toward the lamination interlayer, first edge face and an interior main face,
  the exterior glazing having an exterior face, a second edge face on the side of the first edge face and a main face that is oriented toward the lamination interlayer,
under a peripheral edge of said main face of the exterior glazing, a plurality of inorganic light-emitting diodes that are spaced apart from one another and that each include an emitting surface that is located facing said first edge face, the plurality of inorganic light-emitting diodes being in a common recess of the first edge face, the plurality of inorganic light-emitting diodes being on a front main face of a diode carrier, the front main face of the diode carrier provided with conductive circuits that supply the plurality of inorganic light-emitting diodes, the front main face of the diode carrier including bearing zones that bearing the plurality of inorganic light-emitting diodes, the diode carrier having a fastening portion that is adhesively bonded to a peripheral edge of the interior main face of the interior glazing by an adhesive, a profiled bead, including:
    an exterior lip on said peripheral edge of said main face of said exterior glazing or said second edge face, or both,
    an interior lip on the peripheral edge of said interior main face of the interior glazing, said interior lip not lying against said first edge face
    a body that is located between said exterior lip and said interior lip, said body being located a distance away from said front emitting surface of the light-emitting diodes, and furthermore being located a distance away from said first edge face, the emitting surfaces of the diodes making contact with or being spaced apart by air and by at most 1 mm from said first edge face,
  a protective adhesive strip, including a base and at least one front main adhesive face, with a first end adhesively bonded to a peripheral edge or to a border of the main face of the interior glazing and a second end adhesively bonded toward the interior main face of the interior glazing, the protective adhesive strip forming a seal-tight barrier between the profiled bead and the plurality of inorganic light-emitting diodes, and between the profiled bead and the first edge face, the front main adhesive face being on a back main face of the diode carrier,
    wherein the plurality of inorganic light-emitting diodes are configured to emit one or more visible light rays that are guided in the interior glazing, before light extraction with a light-extracting system, the visible light rays being visible from a side of the interior main face of the interior glazing, or are configured to emit one or more ultraviolet light rays—that are guided in the interior glazing, before conversion into visible light and light extraction, the light rays being visible from a side of the interior main face of the interior glazing, the light-extracting system being within the interior glazing or on main face of the interior glazing or on the interior main face of the interior glazing.

BRIEF DESCRIPTION OF THE DRAWINGS

Other details and advantageous features of the invention will become apparent on reading about examples of luminous glazings according to the invention, which are illustrated by the following figures:

FIG. 1c shows a schematic perspective view of the diode-fastening carrier according to the invention in the first embodiment, FIG. 1d shows a cross-sectional view of a diode-fastening carrier in another embodiment of the invention.

Figure 1:
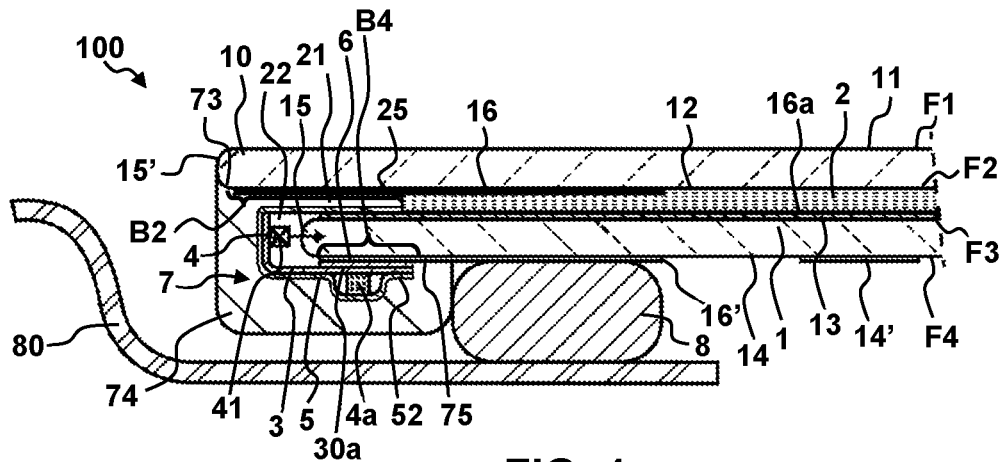
FIGS. 1, 1A, 1B, 2, 3, 4, 5, 6 show schematic partial cross-sectional views of luminous automotive diode-comprising glazings in the embodiments of the invention.

It will be noted that for the sake of clarity the various elements of the objects shown are not necessarily reproduced to scale.

DETAILED DESCRIPTION

The aim of the present invention is to remedy the drawbacks of the prior art by providing a luminous laminated glazing comprising light-emitting diodes that is protected without degrading the optical properties or even complicating fastening or alignment of the diodes.

To this end, the present invention provides a luminous automotive glazing, in particular a luminous side window (quarter window etc.) or luminous glazed roof (hardtop, etc.) of a road vehicle (motor vehicle, truck, coach, bus), comprising a laminated glazing including a first transparent sheet of glass or plastic (in particular polycarbonate) that is the interior glazing, in particular made of clear or extra-clear glass, in particular of a thickness of at most 2.5 mm, a second transparent sheet of glass or plastic (in particular polycarbonate) that is the exterior glazing, in particular tinted in particular for a glazed roof, in particular of thickness of at most 2.5 mm, and a lamination interlayer made of plastic, preferably thermoplastic (in particular of polyvinyl butyral or PVB, in particular colorless or tinted and mono or multilayered), in particular of thickness of at most 1 mm, located between the exterior and interior glazings. Preferably, at least one of the first and second sheets is made of glass and even both.

The interior glazing has a main face called face F3 that is oriented toward the lamination interlayer, an edge face and an interior main face called face F4.

The exterior glazing has an exterior face called face F1, a second edge face on the side of the first edge face and a main face called face F2 that is oriented toward the lamination interlayer.

The lamination interlayer in particular has what is called an external interface on the same side as the first and second edge faces, setback by a least 1 mm and preferably at most 10 mm from the second edge face or even from the first edge face (with the recess), leaving a peripheral groove between the faces F2 and F3.

Said luminous glazing includes, under a peripheral edge B2 of said face F2, a plurality of inorganic light-emitting diodes that are spaced apart from one another, and preferably aligned, and each including a front emitting surface that is located facing said first edge face, the diodes (each including at least one semiconductor chip with an emitting face) being in a common through-hole of the first edge face called the recess (preferably the front emitting surface is entirely in the recess). The recess may be of width of at most 10 mm, of at least 2 mm and better still of 4±1 mm, over all or better still some of one side of the interior glazing (longitudinal or lateral edge), and of length preferably smaller than the length of said side, recess in particular arranged between two no-void-containing borders of said side. The length of the recess may be larger than or equal to the length L of the diode carrier or of all of the preferably connected together diode carriers, in particular L+15 to 50 mm and better still L+20±5 mm.

The diodes are able to emit one or more wavelengths in the visible that are guided in the interior glazing, before light extraction, visible face-F4 side, or able to emit one or more wavelengths in the ultraviolet that are guided in the interior glazing, before conversion into visible light and light extraction, visible F4 side (luminophore, etc.), the light-extracting means being within the interior glazing, such as an internal etching (by laser), or on (preferably directly on) face F3 or on (preferably directly on) face F4. The extracting means may be permanent or removable (sticker, etc.) and repositionable subsequently (sold separately for example).

The diodes are on a front main face F1 of a diode carrier, front face F1 provided with conductive circuits, preferably metal circuits and in particular copper circuits, that supply the diodes, front face F1 thus including zones bearing the diodes, the diode carrier having a portion called the fastening portion that is adhesively bonded to a peripheral edge B4 of the face F4 by an adhesive, in particular a double-sided adhesive.

The luminous automotive glazing furthermore includes a profiled, in particular polymeric, bead (in particular made of polyurethane),—which is preferably an extrudate-including:

an exterior lip on (preferably) said peripheral edge B2 of said face F2 and/or (all or some) said second edge face, preferably without extension onto the face F1, or even set back from the second edge face (above all if polymeric encapsulation in addition), in particularly directly on (making contact with) said peripheral edge B2 or on a layer (adhesion-primer layer optionally masking layer such as an enamel, etc.) of said peripheral edge B2—an interior lip on a peripheral edge B4 of said face F4, in particular said edge B4 with said fastening portion, said interior lip not lying against said first edge face, directly on (in contact with) the edge B4 or on a layer (adhesion-primer layer optionally masking layer such as an enamel or even electrically conductive layer, etc.), optionally adjacent and even in contact with a polymeric encapsulation opening onto face F4 (more toward the interior)

a body located between said exterior lip and said interior lip, with said body located a distance away from said emitting front surface of the light-emitting diodes (without contact with these front emitting surfaces), and furthermore is located a distance away from said first edge face (and without contact), optionally the body does not extend beyond the second edge face the front emitting surfaces of the diodes making contact with or being spaced apart by air from said first edge face and being spaced apart by at most 1 mm and even at most 0.5 mm from said first edge face and even by at most 0.3 mm.—to decrease the loss of light—.

The luminous automotive glazing furthermore includes:

what is called a protective, adhesive, for example dielectric, strip including a preferably polymeric base and at least one adhesively bonded main face and optionally an adhesively bonded back face, which is preferably monolithic or made of a plurality of pieces (for example of two pieces) that are placed end-to-end or that have a zone of overlap, with (for the monolithic strip or the first piece) a first end zone that is adhesively bonded against the peripheral edge B2 (by the adhesively bonded back face) or to the border of the face F3 (by the front face, in the peripheral groove, in particular over a least 1 mm in the groove, preferably as far as to the external end face of the interlayer) and (for the monolithic strip or the second piece) a second end zone that is adhesively bonded face-F4 (front-face) side, forming a seal-tight barrier between the profiled bead and the diodes, and between the profiled bead and the first edge face, and therefore set back from the second edge face, the adhesively-bonded front face being on a back main face Fe of the diode carrier.

Each light-emitting diode is protected by the profiled bead, there is no organic profiled-bead material at the interface between the front emitting surface of each light-emitting diode and the first edge face by virtue of the protective adhesive strip.

The material of said profiled bead is preferably chosen opaque and is thus less susceptible to modification on aging. The polymer material from which the profiled bead is made may be a thermoplastic (PVC, TPE, etc.), a polyurethane or even a synthetic rubber such as EPDM or any other suitable material.

By virtue of the protective adhesive strip, said interior lip does not lie against said first edge face of said interior glass sheet in order not to hinder the emission of light via this first edge face.

Said exterior lip has, preferably, a width comprised between 1.0 and 3.0 mm and/or even a height comprised between 1.0 and 5.0 mm.

Said interior lip has, preferably, a width comprised between 1.0 and 10.0 mm and/or even a height comprised between 1.0 and 3.0 mm.

The upper lip preferably lies along the recess exclusively, over all the length preferably or at least over all the diode-carrier-containing zones The thickness above the face F4 is for example less than 8 mm, for example from 1.5 to 4 mm.

The protective adhesive strip may have one or more of the following other features:
- be monolithic, common to all of the diodes i.e. of the one or more diode carriers
- be made of two or more pieces (with a zone of overlap between pieces)
- electrically insulating
- conformable,
- of thickness smaller than the width of the recess, and/or not extend beyond the lateral ends of the recess
- of thickness of at most 0.5 mm, 0.15 mm for example,
- with a single adhesive front face or two adhesive faces (front and back), in particular a locally adhesive back face for fastening to the face F2 (in direction of the groove in particular over at least 1 mm in the groove and better still as far as to the external end face of the interlayer) in particular without adhesive on the back face making contact with the profiled bead
- include an extension on the face F4 beyond the face Fe, forming a barrier between the profiled bead and the adhesive, in particular double-sided adhesive tape.

The protective adhesive strip may entirely cover the diode carrier with upper portions face-F2 side, lower portions face-F4 side and lateral portions. In short, the strip is of dimensions (width and length) larger than the dimensions of the diode carrier or of all of the diode carriers if a plurality.

To facilitate the passage of the wiring, through-holes may be made in the protective adhesive strip. The supply wires of the diode carrier may be partially covered with the strip and then extend beyond the strip, exit from the recess and optionally are connected to a connector on the face F4.

The base of the protective adhesive strip may be a polymeric material, in particular a vinyl material, for example polyvinyl chloride PVC, or even a polyimide material (Kapton® for example). It is preferable for the base of the strip not to be made of paper or cardboard in order to better withstand an extrusion of the profiled bead and an optional encapsulation by injection molding on the extrusion.

The front and/or back adhesive face may have a pressure-sensitive adhesive.

The adhesive may be silicone (for example on polyimide) or acrylic adhesive (for example on a vinyl material).

The protective adhesive strip may be compatible with the material of the profiled bead or even with the supply cables.

The protective adhesive strip may be stable up to 100° C. in particular in the case of heating caused by the diodes.

The protective adhesive strip may be opaque (colored, white black etc.). The protective adhesive strip may be reflective (metal, aluminum etc.). It is preferably dielectric (in particular polymeric) in order to avoid short-circuiting.

Preferably, the protective adhesive strip may be opaque, in particular with a first end zone adhesively bonded to face F3 or even to face F2 in a peripheral groove. The lamination interlayer being set back from the first edge face, so as to prevent parasitic light from exiting at large angles and passing through the external glazing when the optional encapsulation is flush on the face F4 or more generally when the face F1 and/or the face F2 and/or F3 do not have masking means or insufficient means The protective adhesive strip may at least partially cover the fastening portion, in particular cover an (opto)electrical component on the back face Fe opposite the face F4, and even cover the fastening portion and extend onto the face F4, for example protecting the adhesive between the main face Fi of the carrier and the face F4 in particular if bulk allows it/or if the bead for adhesive bonding to the rabbet of the vehicle body is far away (case of an adhesively bonded hardtop).

The diode carrier may be devoid of portion in contact with the face F2 and even be spaced apart by 0.1 mm or at least the thickness of the interlayer, in particular the bearing zones do not extend beyond the first edge face toward the face F2.

The diode carrier may be devoid of extension into the plane of the face F3, the diode carrier is devoid of portion making contact with the face F2.

The diode carrier may be thin, in particular of thickness smaller than or equal to 1 mm, for example between 0.1 and 0.5 mm, and even 0.15±0.05 mm in thickness.

Provision may be made for a plurality of identical or similar diode carriers instead of a single carrier, in particular if the zones to be illuminated are very far apart from one another.

The fastening portion may be 5±1 mm to 15 mm±10 mm in width, in particular depending on the available space on face F4 (for example with respect to the position of the bead of adhesive for the rabbet of the vehicle body).

The back face Fe may bear at least one (opto)electronic component in particular for controlling the diodes and other conductive (metal, copper, etc.) circuits for said component. The (each) (opto)electronic component may be of at most 5 mm or 3 mm in thickness for example.

By way of (opto)electronic component, mention may be made of a resistor and of a current- or voltage-regulating unit for example ensuring a voltage of 12 V with an electric source at more than 12 V.

It is possible to avoid placing components on the back face Fe opposite each bearing zone, and it is possible to avoid placing components (except the diodes) on each bearing zone. It is possible to employ a microcontroller on the diode carrier or a remote microcontroller (located outside the region of the profiled bead encapsulation).

At least one other similar (or identical) diode carrier located adjacent said diode carrier may be connected in the recess by a cable to said diode carrier.

The diode carrier may be with a base made of flexible, in particular polymeric, material, be dielectric, be a composite. The diode carrier may be a polyimide, an (epoxy) resin composite reinforced with glass fibers (often referred to as an FR-4 board), or even metal (aluminum, copper, etc.). Polyimide films have a higher temperature withstand than alternative PET (polyethylene terephthalate) or even PEN (polyethylene naphthalate) films. Mention may be made, as flexible PCB, of the Akaflex® range of products (in particular PCL FW) from Krempel.

The length of the carrier varies as a function of the number of diodes and of the extent of the surface to be illuminated.

The interior and exterior glazings are curved (about at least one axis of curvature). Provision may be made for a diode carrier that conforms to the curvature of the internal glazing. In particular, the interior glazing is curved, in particular along the first edge face.

In a first embodiment, the diodes are front-emitting diodes and the diode carrier, which is in particular polymeric (in particular polyimide) is of submillimeter-sized thickness (and even at most 0.2 mm thickness) and is flexible. Each of the bearing zones, which are called lateral bearing zones, faces the first edge face, then forming an L-shaped cross section with the fastening portion (via a bend), optionally extended by an extension toward the interlayer for an overall U-shaped cross section (via another bend). The lateral bearing zones are entirely or partially in said recess (and the carrier is spaced apart from the face F2, in particular in the bearing zones). Furthermore, adjacent bearing zones are separated by an aperture, in particular of crenel shape. Between adjacent bearing zones, the diode carrier preferably lies in the extension of the fastening portion (without extending beyond the second edge face).

In the case of an extension towards the interlayer, it is preferable for the diode carrier to have a thickness smaller than 0.1 mm in the peripheral groove and for it to be set back from the end face of the interlayer.

By virtue of each aperture, the diode carrier then follows the longitudinal curvature of the interior glazing.

The aperture is bounded by lateral internal walls, between the bearing zones, and bounded by a bottom. The aperture may be of width of at least 0.1 mm, such as a notch in the diode carrier—and for example at most the distance between the diodes minus 0.1 mm on either side.

The aperture may be centered between neighboring diodes. It is possible to leave at least 0.1 mm between each diode and the internal lateral wall bounding the closest aperture.

Preferably, the bottom of the aperture is lower than the lower edges of the diodes. The bottom may be in the plane of the first edge face (maximum aperture depth), is preferably offset from the first edge face and better still at most is as far as to the front face Fi of the bearing zones (minimum aperture depth).

Preferably, the fastening portion makes an angle with the bearing zone larger than 80° and even than 90°, of 90°±5°, and preferably of 90° to 95°, for a better coupling to the first edge face.

The crenel may be rounded level with the bottom in order to prevent crack initiation.

In the (each) bearing zone, the front face Fi and/or the back face Fe includes a reinforcing layer at least level with the bend—in order to maintain the L-shaped cross section—which is preferably made of a metal such as copper (silver or gold). In particular, the reinforcing layer on the front face Fi forms part of the conductive circuit of the diodes or on the back face Fi of the conductive circuit of another (opto) electronic component in particular for controlling the diodes or of a heat-dissipating zone on the front face Fi and/or back face Fe.

The reinforcing zone serves to preserve the L-shaped cross section (the shape after bending) in order to correctly orientate the (visible or UV) light rays.

In a second embodiment, the diodes are side-emitting diodes, and the bearing zones, which are called facial bearing zones, are in the extension of the fastening portion.

To better center the side-emitting diodes with respect to the first edge face, provision may be made to raise them or to change the cross section of the carrier to a Z-shaped cross section (an L and an extension in the direction opposite from the first edge face), optionally using a back shim.

The diodes may be single semiconductor chips that are for example about 100 µm or 1 mm in size.

The diodes may however comprise a (temporary or permanent) protective package for protecting the chip during handling or to improve the compatibility between the materials of the chip and other materials.

The diodes may be encapsulated, i.e. comprising a semiconductor chip and a package (for example made of an epoxy resin or of PMMA) encapsulating the chip and having multiple functions: protection from oxidation and moisture, scattering or focusing element, wavelength conversion, etc.

The emission pattern of a source may have an emission half angle of 120°.

Typically, a collimated diode has a half-angle at the peak of as low as 2 or 3°.

The diodes are preferably surface-mount devices (SMDs). The diodes (with a single semiconductor chip here) are for example of square shape and of width of about 5 mm or less.

The inorganic light-emitting diode 4 may be a surface mount device (SMD) comprising a peripheral packaging.

In a preferred embodiment, each diode, preferably power diode, being a component including a semiconductor chip and is equipped with a polymeric or ceramic peripheral packaging encapsulating the edge face of the component (and defining the edge face of the diode) and jutting out over the front face of the component, surrounding the semiconductor chip.

The diode can comprise a protective resin or a material having a color conversion function, even just on the semiconductor chip. The semiconductor chip can be embedded in a material (resin, and the like).

The diode can be devoid of optical element above the semiconductor chip (which is or is not embedded in the material) in order to facilitate compactness.

The package may correspond to the maximum thickness (height) of the diode. The packaging is, for example, made of epoxy. A polymeric packaging can optionally shrink (the final thickness after lamination can be less than the initial thickness) during the lamination. The (polymeric) packaging can be opaque.

The packaging (which is monolithic or made of two segments) can comprise a part forming a seating carrying the semiconductor chip and a part forming a reflector which widens with distance from the seating (higher than the chip).

Preferably, the diodes have a Lambertian or quasi-Lambertian emission.

Reference may be made to the work entitled "Les leds pour l'éclairage" [LEDs for Lighting], by Laurent Massol, published by Dunod, for the different types of diodes.

The inorganic diodes are, for example, based on gallium phosphide, gallium nitride or aluminum gallium nitride.

The width (and even length) of a diode with a single semiconductor chip, generally a square-shaped diode, is preferably at most 5 mm and even at most 1 mm.

The spacing between diodes is dependent on the size of the emitting surface and on the emission angle, which is typically 120°. It is preferably at most 20 mm, and typically 10 mm±5 mm. Each diode may include a plurality of semiconductor chips.

The length of a (polychromatic light) diode with a plurality of semiconductor chips (typically surrounded by the peripheral shared packaging), generally of rectangular shape, is preferably at most 20 mm, better still at most 10 mm and even at most 5 mm.

The total number of diodes is defined by the size and location of the zones to be illuminated, by the desired light intensity and by the uniformity required for the light.

For side-emitting diodes, the bearing zones face the edge B2.

Mention may be made, as diodes, of the Oslon Black Flat range sold by Osram. For red light, mention may be made, as diode sold by Osram, of: Oslon Black Flat Lx H9PP. For the orange (amber) light, mention may be made, as diode sold by Osram, of: LCY H9PP. For white light, mention may be made, as diode sold by Osram, of: LUW H9QP or KW HxL531.TE, where x=is the number of chips in the diode (4 or 5, for example).

Said adhesive on face F4 may be dielectric (in order to avoid short-circuits) and a double-sided adhesive tape, in particular a conformable double-sided adhesive tape. This tape may be a continuous strip. The double-sided adhesive tape includes a polymeric core and two main adhesive faces. The core of the protective adhesive strip may be a polymeric material, in particular a vinyl material, for example polyvinyl chloride PVC, or even a polyimide material (Kapton® for example). It is preferable for the core not to be made of paper or cardboard by way of precaution.

The front and/or back adhesive face may have a pressure-sensitive adhesive. The adhesive may be silicone (for example on polyimide) or acrylic adhesive (for example on a vinyl material).

The thickness of the tape may be smaller than 0.5 mm or than 0.3 mm, for example it is 0.13 mm. Mention may be made of the 3M adhesive referenced the VHB F9469PC. The width of the adhesive tape is for example typically 5 to 6 mm. Preferably it does not extend beyond the first edge face and is even set back therefrom.

The luminous automotive glazing may comprise an opaque peripheral masking layer on face F2, located on the peripheral edge B2 and lying between the interlayer and face F2, the protective adhesive strip optionally being on said opaque peripheral masking layer, which is in particular made of enamel, on the exterior glazing made of glass. For example, its length is at most 100 mm and for example 50 mm.

The luminous glazing may comprise an opaque peripheral masking layer on face F3, located on the peripheral edge B3 and lying between the interlayer and face F3, the protective adhesive strip optionally being on said opaque peripheral masking layer, which is in particular made of enamel, on the interior glazing made of glass. The luminous glazing may alternatively (or in addition) comprise an opaque peripheral masking layer on face F4, located on the peripheral edge B4, the protective adhesive strip optionally being on said opaque peripheral masking layer, which is in particular made of enamel, on the interior glazing made of glass, beside the fastening portion, or the profiled bead optionally being on said opaque peripheral masking layer.

When in particular the protective strip does not form a mask (because of its position and/or its nature, which is for example transparent or insufficiently opaque), the glazing may have an additional masking layer (a sheet, a film, a deposit such as of paint, a preferably single-sided adhesive tape, etc.) that is opaque or reflective (for example made of aluminum) lying on said face F2 or F3 in the peripheral groove so as to prevent parasitic light from exiting at large angles and passing through the exterior glazing when the optional encapsulation is flush on face F4 or more generally when the face F1 and/or the face F2 and/or F3 has no masking means or insufficient means. The additional masking layer may alone have an optical density of at least 4.

Preferably, the additional masking layer is on a layer made of enamel on face F2. Together they may have an optical density of at least 4. Preferably, the additional masking layer is on a layer made of enamel on face F3. Together they may have an optical density of at least 4.

The additional masking layer may be applied before lamination and is preferably of thickness smaller than 0.1 in order to prevent breakage.

It is possible to use a low-refractive-index layer on face F3 (optionally under the protective strip, under the enamel) such as a porous silica layer as described in patent application WO2008059170, optionally under a dense silica layer as described in patent application WO2015101745. It is possible to use a low-refractive-index film within the interlayer, such as a fluoropolymer film porous silica layer such as described in patent application WO2015/101745.

An adhesive bead may be on face F4, for example polyurethane serving to fasten the glazing to the rabbet of the vehicle body, adhesive bead adjacent to the profiled bead or even to an encapsulation for example of width of 7 mm by 17 mm+/−5 mm height. The adhesive bead preferably starts at least 10 mm and even 15 mm and less than 30 mm from the first edge face.

The luminous glazing furthermore includes an additional protective profile, at least partially covering, and preferably completely covering, a what is called free main face of said profiled bead, which is the face furthest from the light-emitting diodes, in particular a polymeric encapsulation, in particular made of polyurethane.

Preferably, furthermore, an additional protective profile, in particular 0.5 mm to several cm thick, is manufactured by polymeric encapsulation of said profiled bead. Production of the additional protective profile by injection molding is particularly advantageous because it allows a protection that is durably reliable to be achieved. Production of the additional protective profile by extrusion for example is, certainly more simple, but is limited in the variation of its cross section. The extrusion cross section is set because it is related to the geometry of the nozzle.

The profiled bead is then chosen to be seal tight (and therefore sufficiently resistant) to the injected liquid encapsulation material at a given pressure and temperature.

The polymeric encapsulation may be single-face, two-face or three-face, and in particular on the second edge face and on the face F4 between the profiled bead and the adhesive bead once mounted.

In vehicle applications, the encapsulation material is black or colored (for esthetic and/or masking purposes). This material not being sufficiently transparent to visible radiation, the invention prevents infiltrations in front of the first edge face.

The encapsulation may be made of polyurethane, in particular of PU-RIM (reaction in mold), the two-component PU being cured in the mold, after the two components have been injected simultaneously. This material is typically injected at up to 120° C. or 110° C. and at a few tens of bars.

It is possible to use a one-, two- or three-component primer layer, for example one based on polyurethane, polyester, polyvinyl acetate, isocyanate, etc., of 5 to 30 μm thickness, that promotes adhesion to a mineral glass, and that is:

on the face F2 (or even F4) under the profiled bead
on the face F4 (or the first edge face) under the polymeric encapsulation.

The polymeric encapsulation is on the perimeter of the laminated glazing (is also outside of the recess). The encapsulation may be any shape, with or without a lip, two-face, three-face or even single-face.

The polymeric encapsulation also provides a good esthetic finish and allows other elements or functions to be incorporated:

overmolding of frames,
reinforcing inserts or inserts for attaching the luminous glazing, especially for an opening luminous glazing,
centering pins,
trim,
a multi- (two-, three-, etc.) lipped sealing profile, that is compressed after fitting to the vehicle.

Tubing, in other words a closed-cell sealing strip, may also be joined to the encapsulation, etc.

The extraction face of the interior glass may be frosted, sandblasted, screen-printed, etc. Extraction may be achieved with a sticker (removable sticker, etc.), paint, markings or within the glass by laser etching, etc.

The luminous glazing may incorporate a mineral scattering layer associated with one of the main faces F3 or F4, which face is a luminous face (via extraction of the radiation).

The scattering layer may be composed of elements containing particles and a binder, the binder making it possible to agglomerate the particles together.

The particles may be metal or metal oxides, the size of the particles may be between 50 nm and 1 μm, preferably the binder may be mineral in order to give heat resistance.

In one preferred embodiment, the scattering layer consists of agglomerated particles in a binder, said particles having a mean diameter of between 0.3 and 2 microns, said binder being in a proportion of between 10% and 40% by volume and the particles forming aggregates the size of which is between 0.5 and 5 microns. This preferred scattering layer is particularly described in patent application WO 01/90787.

The particles may be chosen from semi-transparent particles and preferably from mineral particles such as oxides, nitrides, and carbides. The particles will preferably be chosen from the oxides of silica, of alumina, of zirconia, of titanium, of cerium, or from a mixture of at least two of these oxides.

For example, a scattering mineral layer of around 10 μm is chosen.

The extraction of the radiation is adjusted (the diode position and/or type is adjusted to achieve a lighting level, visible in the interior of the vehicle, suitable for reading or for ambient lighting).

The light may be:
continuous and/or intermittent,
monochromatic and/or polychromatic or white.

Visible inside the vehicle, it may thus have a nighttime lighting function or display function for displaying all kinds of information, of design, logo, alphanumeric sign or other signage type.

As decorative features, it is possible to form one or more luminous bands, or a peripheral luminous frame, etc.

The invention furthermore relates to a vehicle including the luminous automotive glazing described above. The profiled bead in particular makes contact with or is spaced apart from a more interior adhesive bead that is adhesively bonded to a rabbet of the body of the vehicle.

The luminous glazing is intended to equip any vehicle:
glazed roof (hardtop, etc.) side windows of a ground vehicle: road vehicle (motor vehicle, public-transport vehicle, truck) or rail vehicle
or even rear windshield, front windshield of a ground vehicle: motor vehicle, utility vehicle, truck, train
porthole or windshield of an air vehicle (airplane, etc.).

The luminous glazing may thus integrate any functionality known in the field of glazing. Among the functionalities added to the glazing, mention may be made of: hydrophobic/oleophobic layer, hydrophilic/oleophilic layer, photocatalytic antifouling layer, stack reflecting thermal radiation (solar control stack) or infrared radiation (low-E stack), antireflection stack.

The laminated glazing may be formed from:
a thick or thin first transparent sheet made of mineral glass (float glass, etc.) or organic glass (PC, PMMA, PU, ionomer resin, polyolefin),
a lamination interlayer made of a given laminating material, and
a second sheet (which is transparent, tinted, optionally opaque and made of mineral glass or organic glass and which has various functionalities: solar control, etc.).

Provision may preferably be made for the first edge face to be rounded. It is possible to capitalize upon refraction at an air/first-sheet interface of suitable geometry (rounded edge, or even beveled edge, etc.) thus allowing the rays to be focused in the first sheet. Provision may be made for the first edge face to be roughened (scattering).

The bending of the glazings can be in one or more directions, for example as described in the document WO2010136702.

By way of interior glazing/interlayer/exterior glazing, the following may in particular be selected:
mineral glass/(preferably PVB) interlayer/mineral glass,
mineral glass/(preferably PVB or even PU) interlayer/polycarbonate optionally with black material peripherally,
(optionally fixed) plastic such as polycarbonate or even PET, polymethyl methacrylate PMMA/(preferably PVB or even PU) interlayer/mineral glass.

The first sheet may be made of soda-lime glass, for example of Planiclear glass from Saint Gobain Glass.

For a glazed roof in particular, the second sheet may be colored, for example made of Venus glass from Saint Gobain Glass.

The glass may optionally have undergone beforehand a heat treatment of the toughening, annealing, tempering, or bending type.

The interior glazing may (depending on the esthetic result or the optical effect desired) be a clear glass (with a light transmission $T_L$ greater than or equal to 90% for a thickness of 4 mm), for example a glass of standard soda-lime composition, or an extra-clear glass ($T_L$ greater than or equal to 91.5% for a thickness of 4 mm), for example a soda-lime-silica glass with less than 0.05% of Fe(III) or $Fe_2O_3$, such as the Diamant® glass from Saint-Gobain Glass or the Optiwhite® glass from Pilkington or the B270® glass from Schott, or a glass of another composition described in the document WO04/025334. It is also possible to choose the Planiclear® glass from Saint-Gobain Glass.

The glass of the first and/or second glazing can be neutral (without coloration) or (slightly) tinted, in particular gray or green, such as the TSA glass from Saint-Gobain Glass. The glass of the interior glazing and/or exterior glazing may have undergone a chemical or heat treatment of the hardening or annealing type or a tempering (in particular in order to obtain a better mechanical strength) or be semitempered.

The light transmission $T_L$ can be measured according to the standard ISO 9050:2003 using illuminant D65 and is the total transmission (in particular integrated over the visible region and weighted by the curve of sensitivity of the human eye), taking into account both direct transmission and possible diffuse transmission, the measurement being carried out, for example, using a spectrophotometer equipped with an integrating sphere, the measurement at a given thickness subsequently being converted, if appropriate, to the reference thickness of 4 mm according to the standard ISO 9050:2003.

Preferably, the glazed roof according to the invention meets current motor-vehicle specifications in particular with respect to light transmittance $T_L$ and/or energy transmittance $T_E$ and/or energy reflectance $R_E$ and/or even with respect to total solar transmittance TST.

The bent laminated glazing according to the invention, in particular sunroof, can have a light transmission $T_L$ of at most 10% and even of 1% to 6%.

For a glazed automobile roof, one at least or all of the following criteria are preferred:
an energy transmission $T_E$ of at most 10% and even of 4 to 6%,
an energy reflection $R_E$ (preferably face F1 side) of at most 10%, better still of 4 to 5%,
and a total transmission of the solar energy TST <30% and even <26%, even from 20 to 23%.

A table A below gives examples of glass sold by the applicant company. The SGS Thermocontrol® Absorbing/Venus glass improves the thermal comfort by absorbing the energy load in the body of the glass. These glasses are divided into two categories: "Vision" (light transmission >70%) and "Privacy" (light transmission <70%).

TABLE A

| Type of glass | $T_L$ (%) | $T_E$ (%) | $R_E$ (%) |
|---|---|---|---|
| SGS Thermocontrol ® Venus Green 55 | 49 | 27 | 7 |
| Green-tinted high-performance//Clear glass | 28 | 16 | 3 |
| SGS Thermocontrol ® Venus Green 35 | 35 | 22 | 5 |
| SGS Thermocontrol ® Venus Grey 10 | 10 | 8 | 1 |
| SGS Thermocontrol ® Absorbing TSA3+ | 71 | 44 | 18 |
| Standard green glass | 78 | 53 | 25 |

The "Vision" glass is suitable for all types of glazing in the vehicle: green/blue/gray, and provides a reduced energy transmission ($T_E$). The most popular color for this purpose is green. It has been chosen due to its neutral appearance, which does not affect the harmony of the colors of a vehicle.

The "Privacy" glass is a glazing which is bulk-tinted for thermal comfort and privacy. It is glazing that is supertinted dark green or dark gray. In order to ensure privacy, this glazing exhibits light transmission values which are below 70%, generally around 55% or less. Due to its dark tint, this type of glass also provides a low UV transmission (UV rays can cause skin irritation).

In most countries, Venus/Privacy glass is suitable for the rear side windows (after the B-pillar), rear window and glazed roof.

SGS THERMOCONTROL® Venus consists of dark grey or dark green supertinted glazing. They have all the thermal advantages of the "Vision" (SGS THERMOCONTROL® type) glass with improved solar protection:
lower energy transmission values (compared to all other glass solutions),
its dark color also blocks UV radiation, which is responsible for skin irritation and discoloration of the passenger compartment,
offers greater privacy for the vehicle's passengers (it is difficult to see through the glass from the outside).

By way of conventional lamination interlayer, mention may be made of flexible PU, a plasticizer-free thermoplastic such as ethylene/ethylene-vinyl-acetate (EVA) copolymer, and polyvinyl butyral (PVB). These plastics for example have a thickness between 0.2 mm and 1.1 mm, and in particular between 0.3 and 0.7 mm.

The PVB interlayer is optionally acoustic and/or tinted or preassembled first PVB sheet/functional transparent plastic film, such as a polyethylene terephthalate film referred to as functional PET (preferably with a functional layer, for example an electrically conductive layer)/second PVB sheet; the optional second sheet is clear or extra-clear.

The transparent plastic film can have a thickness of between 10 and 100 μm. The transparent plastic film can be made of polyamide, polyester, polyolefin (PE: polyethylene, PP: polypropylene), polystyrene, polyvinyl chloride (PVC), polyethylene terephthalate (PET), polymethyl methacrylate (PMMA) or polycarbonate (PC). A clear film is preferred, in particular PET.

Use may be made, as this, of, for example, a clear coated PET film, for example XIR from Eastman, a coextruded PET/PMMA film, for example of the SRF 3M® type, but also numerous other films (for example made of PC, PE, PEN, PMMA, PVC), which are visually as transparent as possible and which are not modified, in the autoclave, as regards their surface and their consistency.

The acoustic PVB interlayer can comprise at least one "central" layer made of viscoelastic plastic with vibro-acoustic damping properties, in particular based on polyvinyl butyral (PVB) and plasticizer, and furthermore comprising two external layers made of standard PVB, the central layer being between the two external layers.

In order to limit heating of the passenger compartment or to limit the use of air conditioning, one of the glazings at least (preferably the exterior glass) is tinted, and/or the laminated glazing may also include a layer that reflects or absorbs solar radiation, preferably on face F4 or on face F2 or F3, in particular a transparent electrically conductive layer, which layer is a layer of transparent conductive oxide, i.e. what is called a TCO layer, (on face F4) or even a stack of thin layers comprising at least one TCO layer, or stacks of thin layers comprising at least one silver layer (on F2 or F3), the or each silver layer being placed between dielectric layers.

It is possible to simultaneously have a (silver-containing) layer on face F2 and/or F3 and a TCO layer on face F4.

The TCO layer (of a transparent electrically conductive oxide) is preferably a layer of fluorine-doped tin oxide ($SnO_2$:F) or a layer of mixed indium tin oxide (ITO).

Other layers are possible, including thin layers based on mixed indium zinc oxides (referred to as "IZOs"), based on gallium-doped or aluminum-doped zinc oxide, based on niobium-doped titanium oxide, based on cadmium or zinc stannate, or based on antimony-doped tin oxide. In the case of aluminum-doped zinc oxide, the doping level (that is to say, the weight of aluminum oxide with respect to the total weight) is preferably less than 3%. In the case of gallium, the doping level can be higher, typically within a range extending from 5 to 6%.

In the case of ITO, the atomic percentage of Sn is preferably within a range extending from 5 to 70% and in particular from 10 to 60%. For layers based on fluorine-doped tin oxide, the atomic percentage of fluorine is preferably at most 5% and generally from 1 to 2%.

ITO is particularly preferred, especially with respect to $SnO_2$:F. Of higher electrical conductivity, its thickness can be smaller to obtain one and the same emissivity level. Easily deposited by a cathode sputtering process, in particular a magnetron cathode sputtering process, these layers are characterized by a lower roughness and thus a lower tendency to foul.

One of the advantages of fluorine-doped tin oxide is, on the other hand, its ease of deposition by chemical vapor deposition (CVD), which, contrary to the cathode sputtering process, does not require a subsequent heat treatment and can be implemented on the float flat glass production line. The term "emissivity" is understood to mean the normal emissivity at 283 K within the meaning of the standard EN12898. The thickness of the low-emissivity (TCO, and the like) layer is adjusted, depending on the nature of the layer, so as to obtain the desired emissivity, which depends on the sought-for thermal performance qualities. The emissivity of the low-emissivity layer is, for example, less than or equal to 0.3, in particular less than or equal to 0.25 or even less than or equal to 0.2. For layers made of ITO, the thickness will generally be at least 40 nm, indeed even at least 50 nm and even at least 70 nm, and often at most 150 nm or at most 200 nm. For layers made of fluorine-doped tin oxide, the thickness will generally be at least 120 nm, indeed even at least 200 nm, and often at most 500 nm.

For example, the low-emissivity layer comprises the following sequence: high-index underlayer/low-index underlayer/a TCO layer/optional dielectric overlayer.

It is possible to choose, as preferred example of low-emissivity layer (protected during a tempering), high-index underlayer (<40 nm)/low-index underlayer (<30 nm)/an ITO layer/high-index overlayer (5-15 nm)/low-index barrier overlayer (<90 nm)/final layer (<10 nm).

Mention may be made, by way of low-emissivity layer, of those described in the patent US2015/0146286, on the face F4, in particular in examples 1 to 3.

In one preferred embodiment:

in particular for a glazed roof, the exterior glazing is tinted and/or the lamination interlayer is tinted over all or some of its thickness and/or face F2 or face F3 or face F4—preferably face F4—of the luminous glazed roof is coated with a low-emissivity layer, in particular one comprising a transparent electrically conductive oxide layer (i.e. what is called a TCO layer) and in particular a stack of thin layers containing a TCO layer or a stack of thin layers containing one or more silver layers;

and/or face F2 or face F3 or face F4—preferably face F3—of the glazed roof is coated with a solar-control layer, in particular one comprising a transparent electrically conductive oxide layer (i.e. what is called a TCO layer) and in particular a stack of thin layers containing a TCO layer or a stack of thin layers containing one or more silver layers;

and/or an additional tinted (polymeric, such as a polyethylene terephthalate PET, and the like) film is between the faces F2 and F3 or (bonded) on F4, indeed even on face F1.

The present invention moreover relates to a process for manufacturing the automotive glazing according to the invention, wherein said profiled bead is positioned by extrusion of a material from which said profiled bead is made, in particular at room temperature or more widely at a temperature of the most 80° C. or 70° C. and better still in a range of 15 or 20° C. to 50° C.

Extrusion is preferred to the hot potting technique.

Furthermore, an additional protective profile is manufactured by encapsulation of said profiled bead (and even on the perimeter of the laminated glazing), by injection molding of the polymeric encapsulation material, preferably at a temperature lower than or equal to 120° C. and preferably at at least 90° C.

Figure 1A:
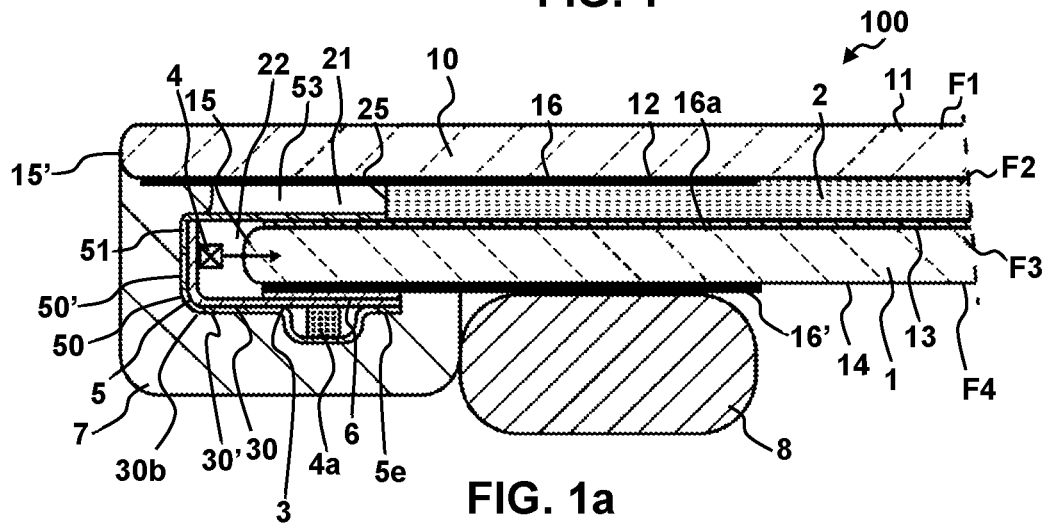

FIG. 1 shows a partial schematic cross-sectional view of a luminous diode-comprising glazing 100 for a glazed motor-vehicle roof in a first embodiment of the invention. FIG. 1*a* is a detail view (zoom) thereof.

This luminous glazing 100 comprises a curved laminated glazing including:

a curved glass sheet 10 forming a for example rectangular exterior glazing having an exterior main face 11 called F1 and an interior main face 12 called F2 and an edge face 15', of the second edge face, for example a sheet of soda-lime glass, of thickness equal to 2.1 mm, optionally, for a solar-control function, a tinted sheet (for example Venus VG10 glass sold by the Applicant), another sheet of curved glass 1 forming an interior glazing of analogous shape to the exterior glazing, for example of rectangular shape, having a main face 13 called F3 and an interior main face 14 called F4, and an edge face 15, of the first edge face, which is preferably rounded (to avoid flakes), for example a sheet of soda-lime glass, of thickness equal to 2.1 mm or less, for example of 0.7 mm, the first edge face having, over a portion of its length, a through-hole (22) called the recess, between the glazings 1, 10, a lamination interlayer 2, for example a for example tinted PVB sheet, of 0.7 mm thickness (made up of one or more sub-sheets, and optionally of acoustic PVB optionally incorporating a functional PET film).

The lamination interlayer 2 has what is called an external end face 25 on the same side as the first and second edge faces, setback by a least 1 mm and preferably at most 10 mm from the second edge face or even from the first edge face (with the recess), leaving a peripheral groove between the faces F2 and F3.

The face F2 comprises a first peripheral opaque masking layer 16 that is located on the peripheral edge B2 and that extends between the interlayer and the face F2, made of black enamel for example. For example, its length is 50 mm.

The face F4 comprises a second peripheral opaque masking layer 16' on face F4, located on the peripheral edge B4, and made of enamel.

The face F3 includes a low-index layer 16*a*, for example a porous silica layer (preferably under a dense silica layer) in order to promote the guidance. The layer may start after the removal of the PVB.

The face F4 includes a scattering layer 14' in order to extract the light. The extraction is by any means: sandblasting, acid etch, scattering layer (enamel, paint, etc.), for example by screen printing or even by internal etching (by laser).

The extraction may form a luminous design, for example a logo or a brand, and the light may be animated.

An adhesive bead 8 is on face F4, for example polyurethane serving to fasten the roof to the rabbet 80 of the vehicle body, adhesive bead adjacent to the profiled bead or even to an encapsulation for example of width of 7 mm by 17 mm+1-5 mm height. The adhesive bead for example starts at 15 mm from the first edge face.

Said roof 100 includes, under a peripheral edge B2 of said face F2, a plurality of inorganic light-emitting diodes 4 that are spaced apart from one another and that each include a front-emitting surface 41 that is located facing said first edge face 15, the diodes being in the recess.

The diodes are on bearing zones of a front main face Fi of a carrier called the diode carrier 3, front face Fi provided with conductive circuits that are preferably made of copper and that supply the diodes, front face Fi thus including bearing zones for the diodes. The diode carrier is devoid of portion making contact with the face F2. The back main face Fe, opposite face F4, bears at least one (opto)electronic component 4a in particular for controlling the diodes and other conductive circuits, which are preferably made of copper, for the component.

The diode carrier is of submillimeter thickness, is flexible and made of polyimide. The diode carrier has what is called a fastening portion 30a that is adhesively bonded to a peripheral edge B4 of the face F4 by an adhesive 6 that is a double-sided adhesive tape (calibrated thickness) including a polymeric core and two adhesive main faces that are conformable, made of a vinyl material, for example of polyvinyl chloride PVC, or even of a polyimide material (Kapton® for example). The adhesive may be silicone (for example on polyimide) or acrylic adhesive (for example on a vinyl material).

The thickness of the adhesive tape is for example 0.13 mm. Mention may be made of the adhesive 3M tape referenced VHB F9469PC. The width of the adhesive tape 6 is for example the width of the fastening portion 30a, typically 5 to 6 mm. It may be set back from the edge face of the fastening portion by 0.1 mm to less than 1 mm for example. It is set back from the first edge face.

Each of the what are called lateral bearing zones faces the first edge face, then forming an L-shaped cross section with the fastening portion, via a bend. The lateral bearing zones are entirely or partially in said recess and adjacent bearing zones are separated by an aperture in particular of crenel shape.

Figure 1B:
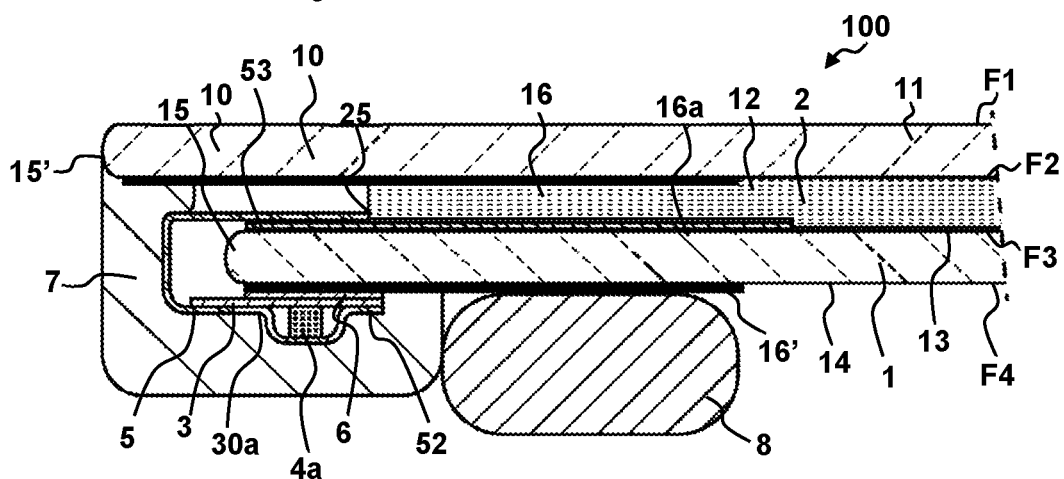

As shown in FIG. 1b, which is a partial cross-sectional detail view in a zone between two diodes, between adjacent bearing zones, the diode carrier lies in the extension of the fastening portion, extending beyond the first edge face, without extension facing the first edge face.

The light-emitting diodes each include at least one emitting chip able to emit one or more rays in the visible, which one or more rays are guided in the first sheet 1. The diodes are small in size, typically a few millimeters or less and in particular about 2×2×1 mm in size, without optics (lens) and preferably not pre-encapsulated in order to decrease bulk as much as possible. Each light-emitting diode is a surface mounted device (SMD) comprising a ceramic or polymeric peripheral packaging. The spacing between diodes is 10 mm±5 mm. The diodes are for example soldered or adhesively bonded to the front face.

The distance between each front emitting surface 41 and the first edge face 15 is minimized. The front emitting surfaces of the diodes making contact with or are spaced apart by air from said first edge face by at most 1 mm and better still at most 0.5 mm from said first edge face.

The main emission direction is perpendicular to the face of the semiconductor chip that for example has a multi-quantum well active layer in an AlInGaP or other semiconductor technology.

The light cone is a Lambertian cone of +/−60°.

It is possible to choose diodes (aligned on the carrier) that emit white light or colored light for ambient lighting, lighting for reading, etc.

Provision may be made for a plurality of diode carriers in the recess, with identical or even distinct functions (choice dependent on the power, emitted light, position and extent of the one or more extraction zones).

The glazing furthermore includes a polymeric profiled bead 7 that is made of polyurethane and obtained by extrusion using nozzles that are for example at room temperature, said bead including:

an exterior lip 73 on said peripheral edge B2 of said face F2 12 (partially under the enamel 16) and here partially on said second edge face 15', an interior lip 75 on a peripheral edge B4 of said interior main face F4 14, said interior lip 75 not lying against said first edge face 15 a body 74 that is located between said exterior lip 73 and said interior lip 75 with said body (74) being located at distance from said front emitting surface 41 of the light-emitting diodes, and furthermore being located at distance from said first edge face 15.

The glazing 100 furthermore includes what is called a protective adhesive strip 5, including a base and at least one what is called front adhesive main face 50—and optionally a back face 50' without adhesive or as a variant adhesive —, with a first adhesively bonded end zone 53 (same side as the adhesive front face 50) on the peripheral edge B2 or as a variant bordering the face F3, and a second adhesively bonded and zone (52) face-F4 side (same side as the front adhesive face 50).

The adhesive front face 50 is on a back main face Fe 30' of the diode carrier 3 opposite the bearing zones (portion 51 of the strip facing the first edge face 15), and lies opposite the fastening tape 6 (portion 52 of the strip, in particular facing the face F4). On face F4, the strip 5 here stops before the end of face of the fastening portion (by extension on the face F4, on the enamel 16').

The protective adhesive strip 5 forms a seal-tight barrier between the profiled bead 7 and the diodes 4 and between the profiled bead and the first edge face via a portion 53, beyond the portion 51, that extends as far as to be adhesively bonded to the edge B2 and preferably as far as to the external end face 25.

The protective adhesive strip is an adhesive tape (calibrated thickness) that is conformable, made of vinyl material, for example of polyvinyl chloride PVC, with an acrylic adhesive, or even made of polyimide material, for example Kapton®, with a silicone adhesive. Mention may be made of the 0.18 mm thick electrically insulating 3M adhesive referenced Scotch® Super 33+™.

When the adhesive strip is opaque, the portion 53 makes it possible to prevent, or participates in preventing, parasitic light from propagating from the border of the second sheet and therefore this light from being seen from the exterior face-F1 side.

FIG. 1c shows a partial schematic perspective view of the diode-fastening carrier according to the invention in the first embodiment, Each of the lateral bearing zones 32 forms an L-shaped cross section with the fastening portion 30a, via a bend 30b.

Adjacent bearing zones 32 are separated by a crenel-shaped aperture 33 (three apertures are shown and three bearing zones). By virtue of each aperture, the diode carrier then follows the longitudinal curvature of the interior glazing.

Each aperture 33 is bounded by lateral internal walls 35, 35', between the bearing zones, and bounded by a bottom 34. The aperture may be centered between neighboring to diodes 41. It is possible to leave at least 0.1 mm between each diode and each internal lateral wall bounding the closest aperture. The aperture may be of width of at least 0.1 mm, such as a notch in the diode carrier—and for a sample at most the distance between the diodes minus 0.1 mm on either side of the two diodes.

The fastening portion 30a makes an angle with the bearing zone 33 larger than 80° and even than 90°, of 90°±5°, and preferably of 90° to 95°.

The crenel 33 may be rounded level with the bottom 34 in order to prevent crack initiation.

In each bearing zone, the front face Fi and the back face Fe include a reinforcing layer 310, 311 at least level with the bend 30b—in order to maintain the L-shaped cross section—which is preferably made of a metal, here copper (or even silver or gold).

Here, the reinforcing layer on the front face Fi 50 forms part of the conductive circuit 31 of the diodes and forms part of a heat-dissipating zone.

Here, the reinforcing layer on the back face 50' forms part of the conductive circuit 31' of the diodes 4 or, on the back face Fi 50', of another (opto)electronic component 4a in particular for controlling the diodes, or forms part of a heat-dissipating zone.

Each reinforcing zone serves to preserve the L-shaped cross section (the shape after bending) in order to correctly orientate the (visible or UV) light rays.

As a first variant, the exterior glazing is made of a plastic such as polycarbonate (optionally with a black peripheral portion).

As a second variant, the interior glazing is made of a plastic such as polycarbonate (optionally with a black peripheral portion) or even of PET or PMMA.

As a variant, UV diodes, in particular UVA diodes, are chosen for example in order to excite luminophores on face 14.

FIG. 1d shows a cross-sectional view of a diode-fastening carrier in another embodiment of the invention, cut in a zone bearing a diode, carrier of L-shaped cross section with a bend 30b.

Each diode is an electronic surface mount device including at least one semiconductor chip 40, and is equipped with a polymeric or ceramic peripheral packaging 42a forming a peripheral encapsulation of the end face of the electronic component.

The package may correspond to the maximum thickness (height) of the diode. The packaging is, for example, made of epoxy. The (polymeric) packaging can be opaque.

The packaging (which is monolithic or made of two segments) can comprise a part forming a seating 42 carrying the chip 40 and a part forming a reflector at a distance from the seating and higher than the chip, containing a protective resin 43 and/or a material having a color conversion function. The emitting front surface 41 can be defined as the surface of this material covering the chip set back from or level with the "front" surface of the reflector.

The anode and cathode contacts 44 are produced, for example, by conductive adhesive bonding to an electrically conductive layer 31 on the front face 30 with an insulated zone 313. The contacts are prolonged by via holes into the seating as far as zones 4 made of layers, one of the zones 45 being connected by a wire to the cathode. The back face 30' may also include a reinforcing and/or heat-dissipating and/or conductive-circuit-forming layer 31', on the fastening portion 30a for example.

Figure 1E:
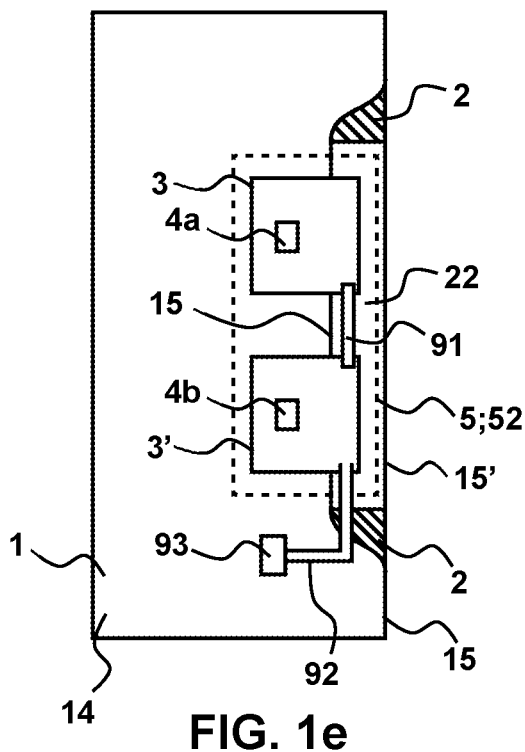
FIG. 1e shows a schematic top view face-F4 side of a luminous automotive diode-comprising glazing according to the invention in the first embodiment.

FIG. 1e shows a schematic top view, from the side of interior main face F4 14, of a luminous automotive diode-comprising glazing 1 in the first embodiment.

It shows the edge face 15' of the exterior glazing, the recess 22 of the first edge face 15, which is cut with a small cutting radius, over a portion of the length of the interior glazing 1, and the removal of the PVB 2 over all or some of the recess 21 (for example still present near the lateral edges of the recess). Two diode carriers 3, 3' are used, each with components 4a, 4b on the back face, said components being connected (electrical link) by a flat cable 91 (in the recess). One of the carriers 3' bears a cable outlet 92 exiting from the recess optionally with an extension on face F4 and extended by a connector 93.

For the sake of clarity, the extent of the protective strip 5 (portion 52 facing the face F4 and extending beyond the face F4) is shown by the dashed lines and the profiled bead has not been shown.

Figure 2:
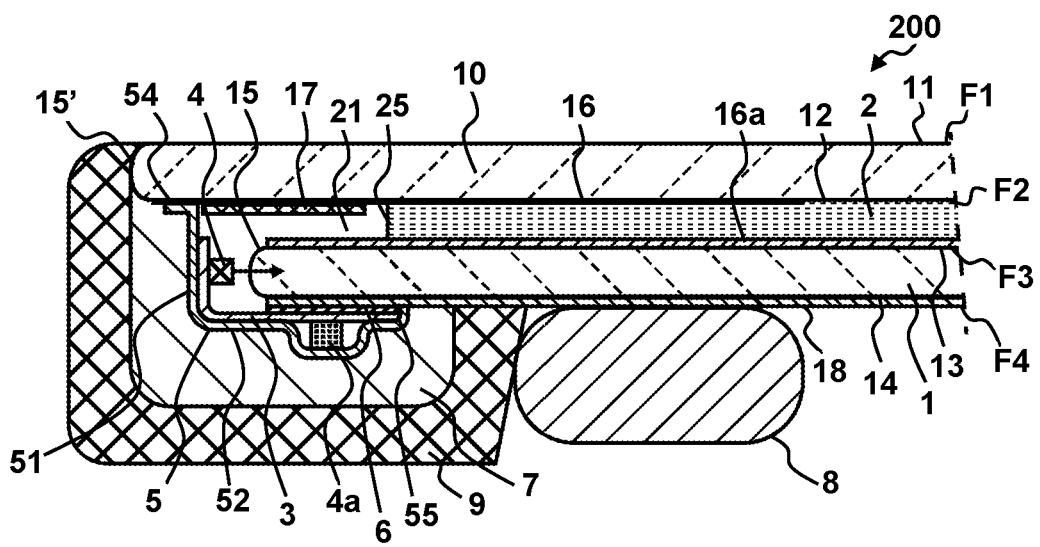

FIG. 2 shows a partial schematic cross-sectional view of a luminous diode-comprising glazing 200 in a second embodiment of the invention.

This luminous glazing 200 differs from the luminous glazing 100 in that:
the protective strip is adhesive on the face F2 (on the enamel 16)
to prevent parasitic light, a reflective (aluminum, etc.) or opaque shield 17 is placed on face F2 again extending into the recess or groove 21 and for example starting in the plane of the diode carrier 3
optionally the masking layer on face F4 is removed and an electrically conductive layer 18 that has a solar-control or another function is deposited (in particular a coating including ITO or even a layer of SnO2:F).

The layer 16a is optional.

As shown in FIG. 2, the diode 4 faces the first edge face 15 of the other sheet of curved glass 1, which has main faces 13, 14.

Figure 3:
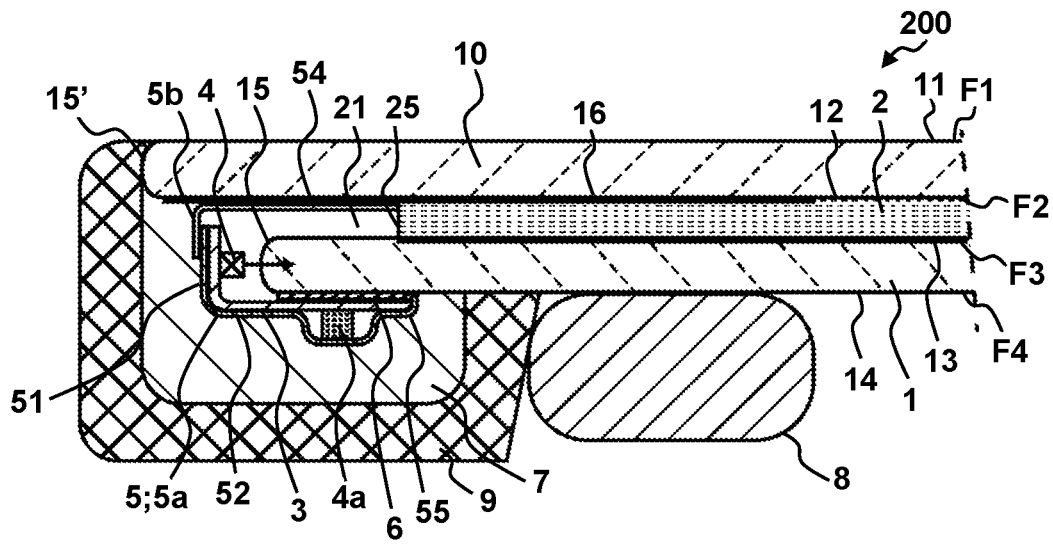

FIG. 3 shows a partial schematic cross-sectional view of a luminous diode-comprising glazing 300 in a third embodiment of the invention.

This luminous glazing 300 differs from the luminous glazing 100 in that:
the protective strip 5 is adhesive on face F2 (on the enamel 16) here is made of two pieces 5a, 5b with a zone of overlap of the two pieces, the second piece 5b is adhesively bonded to face F2 (portion 54 on the enamel 16) the second piece 5b is a double-sided adhesive tape and is preferably opaque in order to prevent parasitic light, the first piece 5a encircling the carrier with the portion 52 may be transparent,
the masking layer is optionally removed from face F4
the low-index layer is optionally removed from face F3.

A polymeric encapsulation 9 is added to the border of the glazing in contact with a free face of the profiled bead 7 (face opposite and furthest from the diode carrier 3). This encapsulation provides a long-term seal (water, cleaning products, etc.). The encapsulation also provides a good esthetic finish and allows other elements or functions (reinforcing inserts, etc.) to be incorporated.

The encapsulation 7 is two-face, on face F4 and on the second edge face 15', and therefore is preferably flush. The encapsulation 7 is for example made of polyurethane black and in particular made of PU-RIM (reaction in mold). This material is typically injected up to 130° C. and at a few tens of bars.

As a variant, the encapsulation is modified in the following way:
a protruding lip is added,
fastening inserts are added,
tubing made of EPDM is added against the encapsulation (in other words, a closed-cell sealing profile or a sealing profile with multiple lips is added against the encapsulation, the profile being squashed after fitting in the vehicle).

Figure 4:
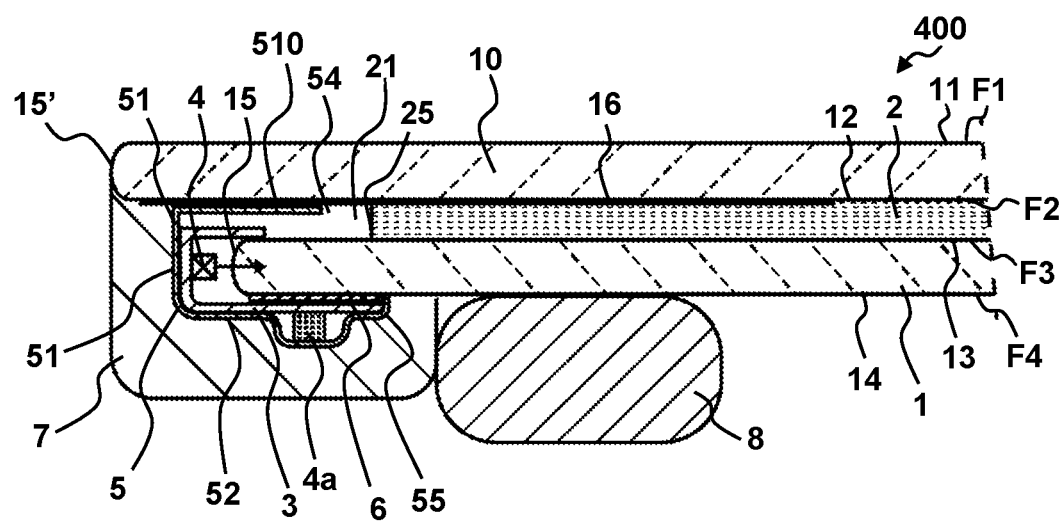

FIG. 4 shows a partial schematic cross-sectional view of a luminous diode-comprising glazing 400 in a fourth embodiment of the invention.

This luminous glazing 400 differs from the luminous glazing 100 in that:
the protective strip 5 is adhesive on face F2 (on the enamel 16) via a portion 54 with a preferably locally adhesively bonded face 510:
the masking layer is optionally removed from face F4
the low-index layer is optionally removed from face F3.

Each of the lateral bearing zones 32 still forms an L-shaped cross section with the fastening portion 30a, via a bend 30b, and is extended by an extension 36 toward the interlayer 2 for a U-shaped total cross section. In the case of this extension 36 toward the interlayer, the diode carrier 3 preferably has a thickness smaller than 0.1 mm in the peripheral groove and is set back from the end face of the interlayer.

Figure 5:
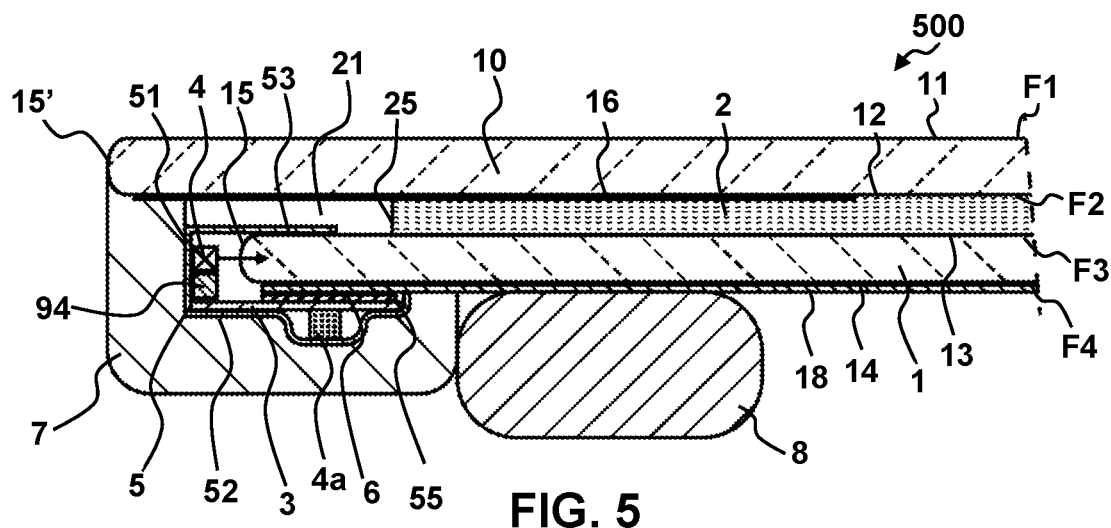

FIG. 5 shows a partial schematic cross-sectional view of a luminous diode-comprising glazing 500 in a fifth embodiment of the invention.

This luminous glazing 500 differs from the luminous glazing 100 in that:
the diodes 4 chosen are here side-emitting diodes, optionally with a raising means 94 for better centering
the protective strip 55 covers the end face of the fastening portion and extends as far as to the face F4
the masking layer is optionally removed from face F4
the low-index layer is optionally removed from face F3.

Figure 6:
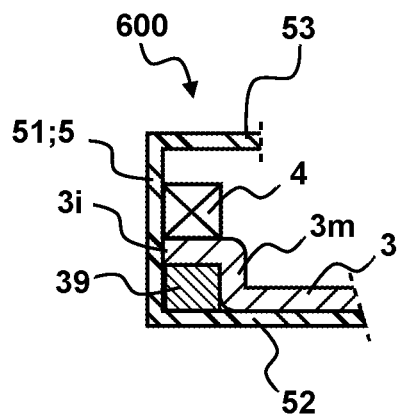

FIG. 6 shows a partial schematic cross-sectional detail view of a luminous diode-comprising glazing 600 in a sixth embodiment of the invention.

This luminous glazing 600 differs from the luminous glazing 500 in that the cross section of the carrier 3 is a Z-shaped cross section (an L 3m and an extension 3i in the direction opposite the first edge face), a back shim 39 optionally being used.

The invention claimed is:
1. A luminous automotive glazing, said glazing comprising:
a laminated glazing including a first transparent sheet of glass or plastic forming an interior glazing, a second transparent sheet of glass or plastic forming an exterior glazing and a lamination interlayer made of plastic located between the exterior and interior glazings
the interior glazing having a main face that is oriented toward the lamination interlayer, first edge face and an interior main face,
the exterior glazing having an exterior face, a second edge face on the side of the first edge face and a main face that is oriented toward the lamination interlayer,
under a peripheral edge of said main face of the exterior glazing, a plurality of inorganic light-emitting diodes that are spaced apart from one another and that each include an emitting surface that is located facing said first edge face, the plurality of inorganic light-emitting diodes being in a common recess of the first edge face,
the plurality of inorganic light-emitting diodes being on a front main face of a diode carrier, the front main face of the diode carrier provided with conductive circuits that supply the plurality of inorganic light-emitting diodes, the front main face of the diode carrier including bearing zones that bear the plurality of inorganic light-emitting diodes, the diode carrier having a fastening portion that is adhesively bonded to a peripheral edge of the interior main face of the interior glazing by an adhesive,
a profiled bead, including:
an exterior lip on said peripheral edge of said main face of said exterior glazing or said second edge face, or both,
an interior lip on the peripheral edge of said interior main face of the interior glazing, said interior lip not lying against said first edge face
a body that is located between said exterior lip and said interior lip, said body being located a distance away from said emitting surface of the light-emitting diodes, and furthermore being located a distance away from said first edge face, the emitting surfaces of the diodes making contact with or being spaced apart by air and by at most 1 mm from said first edge face,
a protective adhesive strip, including a base and at least one front main adhesive face, with a first end adhesively bonded to a peripheral edge or to a border of the main face of the interior glazing and a second end adhesively bonded toward the interior main face of the interior glazing, the protective adhesive strip forming a seal-tight barrier between the profiled bead and the plurality of inorganic light-emitting diodes, and between the profiled bead and the first edge face, the front main adhesive face being on a back main face of the diode carrier,
wherein the plurality of inorganic light-emitting diodes are configured to emit one or more visible light rays that are guided in the interior glazing, before light extraction with a light-extracting system, the visible light rays being visible from a side of the interior main face of the interior glazing, or are configured to emit one or more ultraviolet light rays that are guided in the interior glazing, before conversion into visible light and light extraction, the light rays being visible from a side of the interior main face of the interior glazing, the light-extracting system being within the interior glazing or on main face of the interior glazing or on the interior main face of the interior glazing.

2. The luminous automotive glazing as claimed in claim 1, wherein the first end is adhesively bonded to the main face of the interior glazing or the main face of the exterior glazing in a recess between the main faces of the interior and exterior glazings.

3. The luminous automotive glazing as claimed in claim 1, wherein the protective adhesive strip is opaque or reflective, with a polymeric base.

4. The luminous automotive glazing as claimed in claim 1, wherein the protective adhesive strip at least partially covers the fastening portion.

5. The luminous automotive glazing as claimed in claim 1, wherein the diode carrier is devoid of a portion making contact with the main face of the exterior glazing and with the main face of the interior glazing.

6. The luminous automotive glazing as claimed in claim 1, wherein the back main face is opposite the interior main face of the interior glazing and bears at least one (opto) electronic component and other conductive circuits for the component.

7. The luminous automotive glazing as claimed in claim 1, wherein the interior and exterior glazings are curved.

8. The luminous automotive glazing as claimed in claim 1, wherein the diode carrier is of submillimeter-sized thickness and is flexible, the plurality of inorganic light-emitting diodes are front-emitting diodes, and each of the bearing zones faces the first edge face, and wherein the bearing zones form an L-shaped cross section with the fastening portion, and adjacent bearing zones are separated by an aperture.

9. The luminous automotive glazing as claimed in claim 8, wherein the aperture is bounded by lateral internal walls, between adjacent bearing zones, and bounded by a bottom, of width of at least 0.1 mm.

10. The luminous automotive glazing as claimed in claim 8, wherein the bearing zones each have a front face and a back face and wherein, in the bearing zones, the front face or the back face, or both, includes a reinforcing layer.

11. The luminous automotive glazing as claimed in claim 1, wherein the bearing zones are in the extension of the fastening portion.

12. The luminous automotive glazing as claimed in claim 1, wherein said adhesive on the interior main face of the interior glazing, which is dielectric, is a double-sided adhesive tape including a polymeric core and two adhesive main faces.

13. The luminous automotive glazing as claimed in claim 1, further comprising an opaque peripheral masking layer on the main face of the exterior glazing, located on the peripheral edge and lying between the interlayer and the main face of the exterior glazing.

14. The luminous automotive glazing as claimed in claim 1, further comprising an opaque peripheral masking layer on the interior main face of the interior glazing, located on the peripheral edge, the profiled bead being on said opaque peripheral masking layer.

15. The luminous automotive glazing as claimed in claim 1, further comprising a polymeric encapsulation, at least partially covering a free main face of said profiled bead, which is the face furthest from the light-emitting diodes.

16. The luminous automotive glazing as claimed in claim 1, further comprising a transparent electrically conductive layer on interior main face of the interior glazing.

17. A method comprising utilizing the luminous automotive glazing as claimed in claim 1 as a luminous glazed roof of a road or rail vehicle.

18. A vehicle incorporating the luminous automotive glazing as claimed in claim 1.

19. A process for manufacturing the luminous automotive glazing as claimed in claim 1, wherein said profiled bead is positioned by extrusion of a material from which said profiled bead is made.

20. The process for manufacturing the luminous automotive glazing as claimed in claim 19, further comprising manufacturing a protective profile by encapsulation of said profiled bead, by injection molding of a polymeric encapsulation material.

* * * * *